United States Patent [19]

Shinozaki

[11] 4,453,233

[45] Jun. 5, 1984

[54] SEMICONDUCTOR MEMORY DEVICE AND METHOD OF MANUFACTURING THE SAME

[75] Inventor: Satoshi Shinozaki, Yokohama, Japan

[73] Assignee: Tokyo Shibaura Denki Kabushiki Kaisha, Japan

[21] Appl. No.: 344,048

[22] Filed: Jan. 29, 1982

[30] Foreign Application Priority Data

Feb. 13, 1981 [JP] Japan .................................. 56/19926

[51] Int. Cl.³ ............................................. G11C 13/00
[52] U.S. Cl. ...................................... 365/182; 365/51
[58] Field of Search ................. 365/51, 174, 182, 189, 365/230

[56] References Cited

U.S. PATENT DOCUMENTS 3,653,005 3/1972 Porter .................................. 365/51
3,835,457 9/1974 Yu ....................................... 365/187
4,084,108 4/1978 Fujimoto ............................. 365/187

FOREIGN PATENT DOCUMENTS 48-97457 12/1973 Japan .

OTHER PUBLICATIONS

Tang et al., "Sub-Nanosecond Self-Aligned I²L/MTL Circuits", 1979 IEDM Tech. DIG. 201.

Primary Examiner—Terrell W. Fears
Attorney, Agent, or Firm—Finnegan, Henderson, Farabow, Garett & Dunner

[57] ABSTRACT

A programmable semiconductor memory device with an emitter follower type poly-silicon fuse comprises: a first semiconductor region of first conductivity type; a first insulation layer for separating elements formed in the first semiconductor region; a second semiconductor region of second conductivity type connected to the first semiconductor region, and formed in an island fashion by the first insulation layer; a third semiconductor region of first conductivity type provided in the second semiconductor region; a poly-silicon wiring layer connected to the third semiconductor region and extending over the first insulation layer, the poly-silicon wiring layer containing high concentration impurity of first conductivity and serving as a fuse; a first insulating film formed on the surface of the poly-silicon wiring layer; a second insulating film formed on the side face of the poly-silicon wiring layer; and an electrode connected to the second semiconductor region through a contact hole formed in self-alignment with the second insulating film.

3 Claims, 19 Drawing Figures

SEMICONDUCTOR MEMORY DEVICE AND METHOD OF MANUFACTURING THE SAME

BACKGROUND OF THE INVENTION

The present invention relates to a semiconductor device and a method of manufacturing the same, and more particularly to a structure of a programmable read only memory (PROM) with a poly-silicon fuse of the emitter follower type and a method of manufacturing the same.

With more multifunction and higher operation speed of recent microprocessors, there are increasing demands of larger capacity and higher speed of the PROM. The bipolar type PROM is inferior to the MOS type PROM in that the data once written into the bipolar type PROM can not be corrected. Nevertheless, it is superior to the latter in that the access time is much shorter than that of the latter and it has a higher reliability.

The writing method of the bipolar type PROM is categorized into a fuse melting method (a diode junction type or an emitter follower type) and avalanche induced migration (AIM) method, depending on the cell structure. The fuse melting method is disclosed in Japanese Patent Disclosure (KOKAI) No. 48-97457, for example. In this device, the base contact hole and the emitter contact hole must be provided with a sufficient separation. Accordingly, the base contact hole occupies a larger area in the cell area, so that the improvement of an integration density of the device is hindered. Further, a parasitic capacitance formed between a word line and collector-base junctions grows to an extent that it is not negligible, thereby to prevent the improvement of the operation speed of the device.

SUMMARY OF THE INVENTION

Accordingly, a first object of the present invention is to provide a semiconductor memory device of the poly-silicon fuse type in which a high integration is realized by reducing the area of the semiconductor area connected to a wiring line and a high operation speed is realized by reducing the parasitic capacitance of the wiring line.

A second object of the present invention is to provide a method of manufacturing the same.

According to one aspect of the present invention, there is provided a semiconductor memory device comprising: a first semiconductor region of first conductivity type; a first insulation layer for separating elements formed in the first semiconductor region; a second semiconductor region of second conductivity type contacting with the first semiconductor region, and formed in an island fashion by the first insulation layer; a third semiconductor region of first conductivity type provided in the second semiconductor region; a poly-silicon wiring layer connected to the third semiconductor region and extending over the first insulation layer, the poly-silicon wiring layer containing high concentration impurity of first conductivity and serving as a fuse; a first insulating film formed on the surface of the poly-silicon wiring layer; a second insulating film formed on the side face of the poly-silicon wiring layer; and an electrode connected to the second semiconductor region through a contact hole formed in self-alignment with the second insulating film.

As described above, when a contact hole is formed in a self-alignment manner with the second insulating film, a distance between the poly-silicon wiring layer and an electrode formed in the contact hole can effectively be reduced, so that the integration density can be improved. Further, since the PN junction area is reduced, the parasitic capacitance may be reduced.

When a second insulating layer ranging from the surface of the third semiconductor region to the surface of the second semiconductor region is formed between the electrode and the poly-silicon wiring layer, it is prevented that a voltage breakdown takes place between the third semiconductor region and the electrode.

According to another aspect of the invention, there is provided a method of manufacturing a semiconductor memory device comprising the steps of: forming a first semiconductor region of first conductivity type in an island fashion separated from a semiconductor substrate of first conductivity type by an insulation layer; forming a second semiconductor region of second conductivity type by doping second conductivity type impurity into the entire surface of the first semiconductor region; depositing a poly-silicon film containing first conductivity impurity at high concentration on the exposed second semiconductor region and the insulation layer; forming a poly-silicon wiring layer by selectively etching the poly-silicon film, the poly-silicon wiring layer being connected at one end portion to the second semiconductor region and extending at the other end over the insulation layer, while a part of the poly-silicon wiring layer being finely formed so as to have a fuse function; selectively forming a third semiconductor region by diffusing the first conductivity type impurity in the poly-silicon wiring layer into the second semiconductor region through a heat treatment; forming a first insulating film on the surface of the poly-silicon wiring layer, a second insulating film on the side face of the poly-silicon wiring layer, and a third insulating film on the exposed second semiconductor region, the third insulating film being thinner than the first and second insulating films; forming a contact hole self-aligned with the second insulating film on the side face of the poly-silicon wiring layer by removing the third insulating film on the second semiconductor region; and forming an electrode connected to the second semiconductor region through the contact hole.

According to yet another aspect of the invention, there is provided a second method of manufacturing a semiconductor memory device comprising the steps of: forming a first semiconductor region of first conductivity type in an island fashion separated from a semiconductor substrate of first conductivity type by a first insulation layer; forming a second semiconductor region of second conductivity type by doping second conductivity type impurity into the entire surface of the first semiconductor region; forming a second insulation layer on the exposed second semiconductor region; forming an impurity diffusion window by selectively etching the second insulation layer; depositing a poly-silicon film containing high concentration impurity of first conductivity type on the exposed second semiconductor region and the first and second insulation layers; forming a poly-silicon wiring layer by selectively etching the poly-silicon film, the poly-silicon wiring layer being connected at one end portion to the second semiconductor region through the impurity diffusion window and extending at the other end portion over the first insulation layer, while a part of the poly-silicon wiring layer being finely formed so as to have a fuse function; selectively forming a third semiconductor region by diffusing the first conductivity impurity contained in the poly-silicon wiring layer into the second semiconductor region through a heat treatment; forming a first insulating film on the surface of the poly-silicon wiring layer, and a second insulating film on the side face of the poly-silicon wiring layer; forming a contact hole self-aligned with the second insulating film on the side face of the poly-silicon wiring layer by etching the second insulation layer on the second semiconductor region; and forming an electrode connected to the second semiconductor region through the contact hole.

BRIEF DESCRIPTION OF THE DRAWINGS

Other objects and advantages of the invention will be apparent from the following detailed description when taken in connection with the accompanying drawings.

DETAILED DESCRIPTION OF THE PREFERRED EMBODIMENTS

A semiconductor memory device and a method of manufacturing the same according to the present invention will be described referring to FIGS. 1A to 1E and FIG. 2.

Figure 1A:
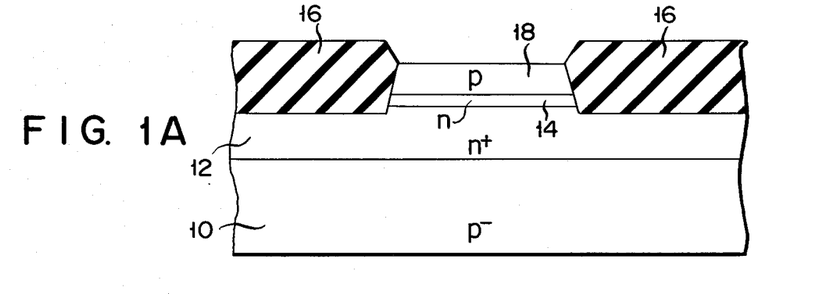
FIGS. 1A to 1E are cross sectional views of a semiconductor substrate for illustrating a first embodiment of a method of manufacturing a semiconductor device according to the present invention.

An n+ buried layer is formed in a p⁻-type silicon substrate 10, as shown in FIG. 1A. An n-type silicon epitaxial layer 14 is formed on the buried layer 12. Then, by the selective oxidization process, a field oxidation film 16 as a first insulation layer reaching the n+ buried layer 12 is formed. Through this step, the epitaxial layer 14 is separated in an island fashion. The island silicon epitaxial layer 14 is doped with p-type impurity, for example, boron by the diffusion process or the ion-implantation. Then, the substructure is subjected to a heat treatment, to form a p-type base region 18 of 0.5 $\mu$m in the vertical diffusion distance Xj, and 600 $\Omega/\square$ in the sheet resistivity.

Figure 1B:
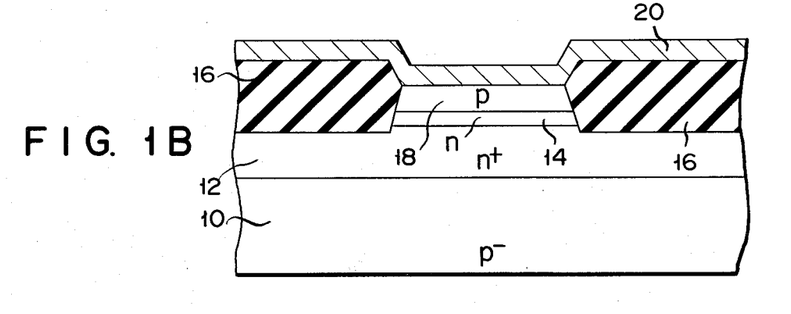

An oxide film (not shown) formed on the base region 18 by the heat process is etched away to expose the base region 18. As shown in FIG. 1B, a high concentration arsenic doped poly-silicon film 20 with 3,000 Å is deposited on the substructure.

Figure 1C:
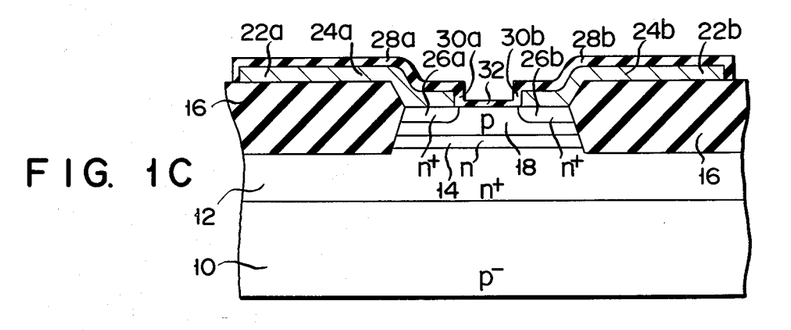
Figure 2:
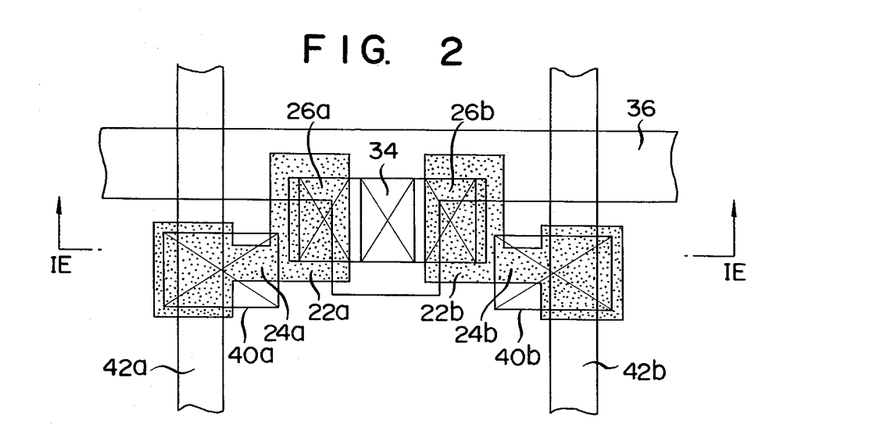
FIG. 2 is a plan view of a semiconductor memory device shown in FIG. 1E.

As shown in FIG. 1C, the poly-silicon film 20 is patterned by a photo engraving process to form two poly-silicon wiring layers 22a and 22b disposed substantially symmetrically with respect to the base region 18. The poly-silicon wiring layers 22a and 22b each contact at one end with a part of the base region and extends at the other end portion over the field oxide film 16. The poly-silicon wiring layers 22a and 22b have narrow width fuses 24a and 24b on the field oxide film 16, as shown in FIG. 2, respectively. Then, the substructure is subjected to a heat treatment in an oxygen-nitrogen mixed atmosphere at 1,000° C. Through the heat treatment, arsenic is diffused from the poly-silicon wiring layers 22a and 22b into the base region 18, thereby to form n+-type emitter regions 26a and 26b. Then, the substructure is subjected to a heat treatment in a wet atmosphere at 900° C., so that a first silicon oxide film 28 is formed on the surfaces of the poly-silicon wiring layers 22a and 22b, a second silicon oxide film 30 is formed on the side faces of the poly-silicon wiring layers 22a and 22b, and a third silicon oxide film 32 is formed on the exposed base region 18. Since the poly-silicon layers 22a and 22b are high in impurity concentration and the exposed base region 18 is formed of a silicon epitaxial layer, there is a slight oxidizing rate difference between them. Therefore, the first silicon oxide film 28 and the second silicon oxide film 30 are formed remarkably thicker than the third silicon oxide film 32. For example, if the substructure is subjected to a heat treatment in a wet atmosphere at 900° C. for 20 minutes, first silicon oxide films 28a and 28b of 2,600 Å, second silicon oxide films 30a and 30b of 2,600 Å, and a third silicon oxide film 32 of 600 Å are formed.

Figure 1D:
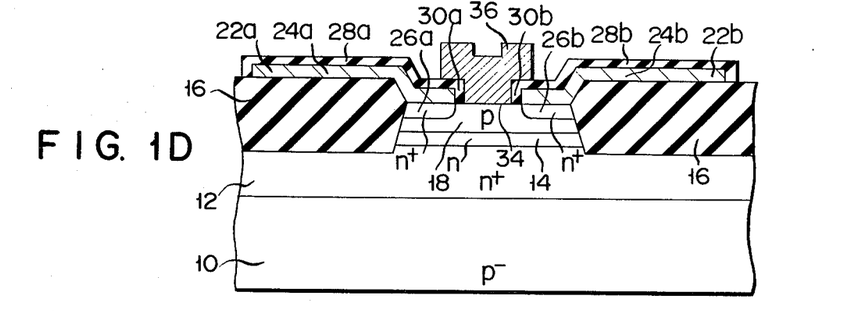

As shown in FIG. 1D, by the hydrogen fluoride treatment, a thin third silicon film 32 is removed from the base region 18. A base contact hole is self-aligned with the second silicon oxide films 30a and 30b formed on the side walls of the poly-silicon wiring layers 22a and 22b. Then, an Al film is deposited over the entire surface of the substructure and the Al film is patterned to form a base Al wiring layer 36 serving as a word line. The base Al wiring layer 36 is insulated from the emitter regions 26a and 26b by the second silicon oxide films 30a and 30b.

Figure 1E:
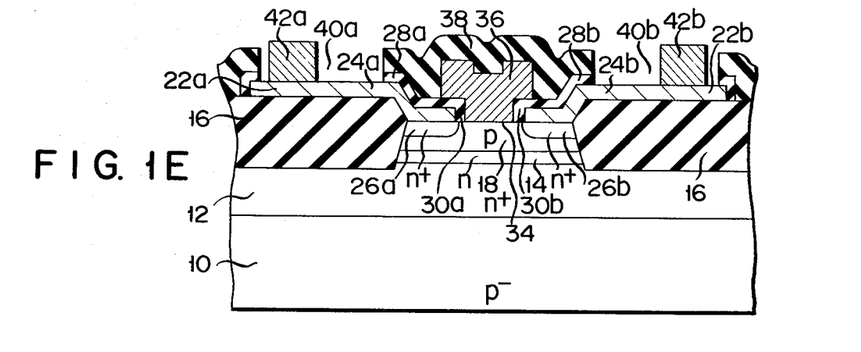

In the next step, a phospho-silicate glass layer (PSG layer) is deposited over the entire surface of the substructure, as shown in FIG. 1E. Following this, the PSG layer 38 and the first silicon oxide layers 28a and 28b are selectively etched to form through-holes 40a and 40b. Then, an aluminum film is formed over the entire surface of the substructure and it is patterned to form Al wiring layers 42a and 42b serving as bit lines connected to the poly-silicon wiring layers 22a and 22b through the through-holes 40a and 40b. Through the above-mentioned steps, two memory cells are formed in the n-type epitaxial layer 14 separated in an island fashion. FIG. 2 is a plan view of the memory cells, and FIG. 1E is a cross sectional view taken on line 1E—1E in FIG. 2.

In the semiconductor memory device thus constructed, the base contact hole 34, disposed between the emitter regions 26a and 26b, are self-aligned with these layers 26a and 26b, with the second silicon oxide films 30a and 30b as a mask, respectively. Therefore, the area of the base contact hole 34 is reduced to one third that of the conventional semiconductor memory device. Then, the area of the memory cell is reduced to an 80% area of the conventional one. Further, decrease of the area of the base region 18 makes parasitic capacitance of the base Al wiring layer 23 (word line) remarkably reduced. This indicates that the improvement of the operation speed is attained.

In the above-mentioned method, the silicon wiring layers 22a and 22b doped with an arsenic at high concentration are used as diffusion sources for forming the emitter regions 26a and 26b. The polysilicon wiring layers 22a and 22b have higher oxidizing rate than the base region 18 formed by the epitaxial layer. Therefore, oxide films formed on side faces of the poly-silicon wiring layers 22a, 22b is thicker than that on the base region. By making use of a difference between the thicknesses of the oxide films, the base contact hole 34 may be self-aligned with the emitter regions 26a and 26b with the second silicon oxide films 30a and 30b on the side faces of the poly-silicon wiring layers 22a and 22b as a mask, respectively.

Figure 3:
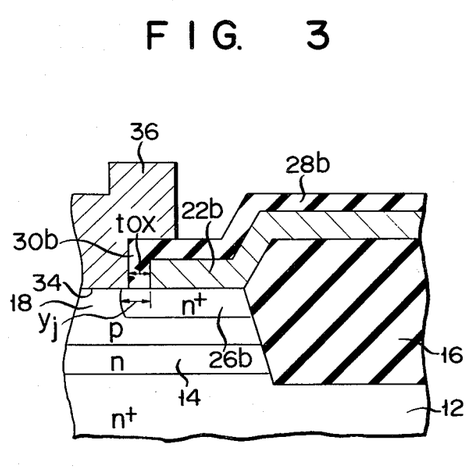
FIG. 3 is a partial cross sectional view of a semiconductor memory device for illustrating a base-emitter short-circuiting.
Figure 4:
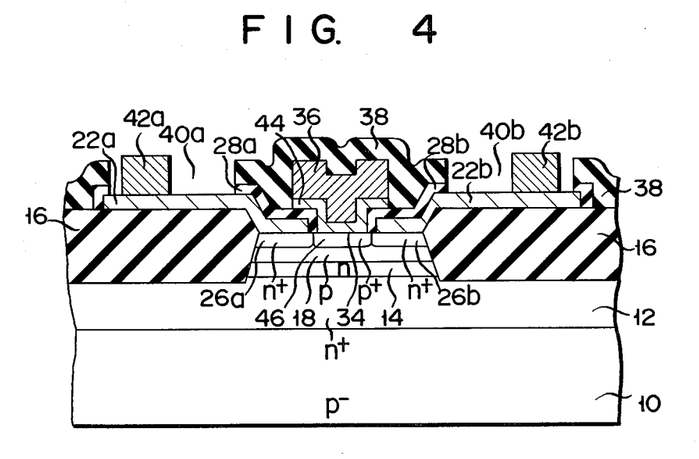
FIG. 4 is a cross sectional view of a modification of the first embodiment of a semiconductor memory device according to the present invention.

As shown in FIG. 3, when a lateral diffusion length $Y_j$ of the n+-type emitter region 26b is larger than the thickness $t_{ox}$ of the second oxide film 30b on the side face of the poly-silicon wiring layer 22b, the base Al wiring layer 36 and the emitter region 26b are short-circuited. To avoid the short-circuiting, after the base contact hole 34 is formed, a poly-silicon layer of 1,000 Å in thickness doped with impurity of the same conductivity type as that of the base region 18, for example, boron, is formed in the base contact hole 34. After this, boron is diffused from the poly-silicon layer 44 into the base region 18 by the heat treatment, thereby to form an impurity region 46 of p+-type. Then, an Al wiring layer 36 is formed on the poly-silicon layer 44. According to this manufacturing method, the p+-type impurity region 46 may be formed which is laterally diffused from the boundary between the second silicon oxide films 30a and 30b on the side faces of the poly-silicon wiring layers 22a and 22b and the poly-silicon layer 44. Accordingly, a PN junction between the n+-type emitter regions 26a and 26b and the impurity region 46 of p+-type is formed toward the emitter regions 26a and 26b with respect to the boundary between the second oxide films 30a and 30b and the poly-silicon layer 44, thereby to prevent the short-circuiting between the emitter and the base.

Figure 5A:
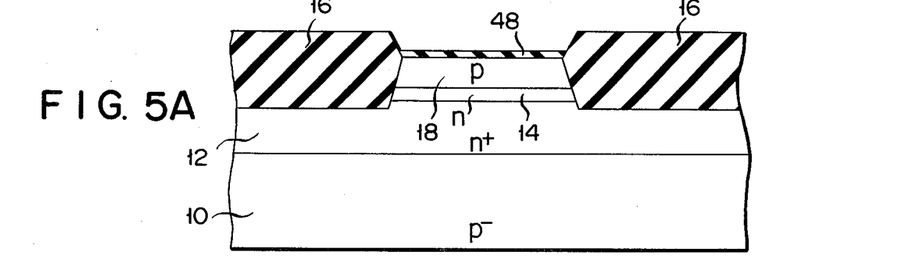
FIGS. 5A to 5E are cross sectional views of a semiconductor substrate for illustrating a second embodiment of a method of manufacturing a semiconductor memory device according to the present invention.

A second embodiment of a semiconductor memory device according to the present invention will be described referring to FIGS. 5A to 5E, and FIG. 6. As shown in FIG. 5A, an n+ buried layer 12 is formed on a p−-type silicon substrate 10. A silicon epitaxial layer 14 is grown on the n+ buried layer 12. Then, the substructure is subjected to the selective oxidizing treatment to form a field oxide film 16 as a first insulation layer reaching the n+ buried layer 12, thereby to separate the silicon epitaxial layer 14 in an island fashion. The substructure is doped with boron as p-type impurity from the surface of the island silicon epitaxial layer 14 by the diffusion process or the ion-implantation process. In the next step, the substructure is subjected to a heat treatment to form a p-type base region 18 in which the longitudinal diffusion distance $X_j = 0.5$ μm and the sheet resistance $\rho_s = 600$ Ω/□. A silicon nitride layer 48 of 1,000 Å in thickness as a second insulation layer is formed on a buffer oxide layer (not shown) of about 100 Å formed on the base region 18 by the heat treatment.

Figure 5B:
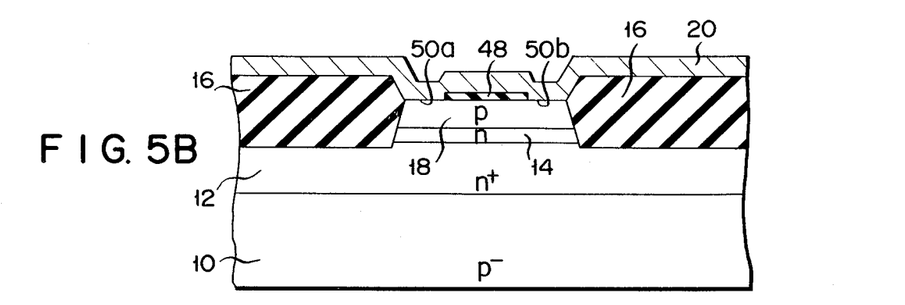

As shown in FIG. 5B, the silicon nitride layer 48 and the buffer oxide are selectively etched away to form emitter diffusion windows 50a and 50b. A poly-silicon film 20 of 3,000 Å in thickness doped with a high concentration arsenic is deposited over the entire surface of the substructure.

Figure 5C:
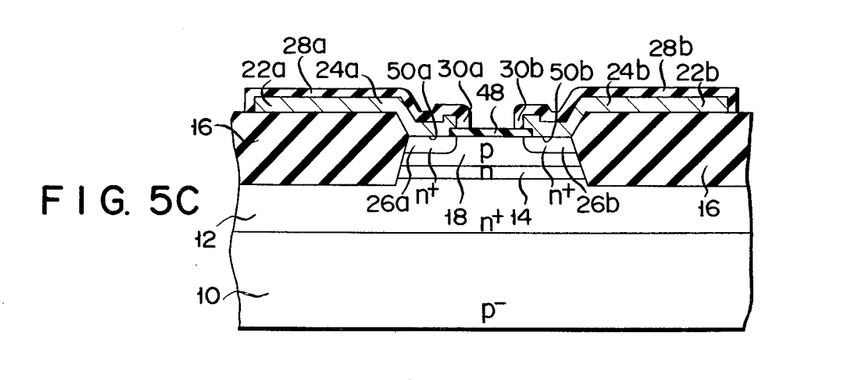

As shown in FIG. 5C, the poly-silicon film 20 is patterned by the photo engraving process to form two poly-silicon wiring layers 22a and 22b disposed substantially symmetrically with respect to the base region 18. The silicon wiring layers 22a and 22b contact at one end portions with parts of the base region 18 through the emitter diffusion windows 50a and 50b, and extend at the other end portions over the field oxide film 16, respectively. Poly-silicon wiring layers 22a and 22b have narrow fuses 24a and 24b on the field oxide film 16, as in the first embodiment. Then, the substructure is subjected to a heat treatment at 1,000° C. in an atmosphere of oxygen and nitrogen to diffuse arsenic into the base region 18 from the poly-silicon wiring layers 22a and 22b, thereby to form n+-type emitter regions 26a and 26b. Then, the substructure is subjected to a thermal oxidation process in a wet oxygen atmosphere at 900° C., thereby to form first oxide films 28a and 28b of 2,600 Å in thickness on the poly-silicon wiring layers 22a and 22b, and to form second oxide films 30a and 30b of 2,600 Å in thickness on the side faces thereof.

Figure 5D:
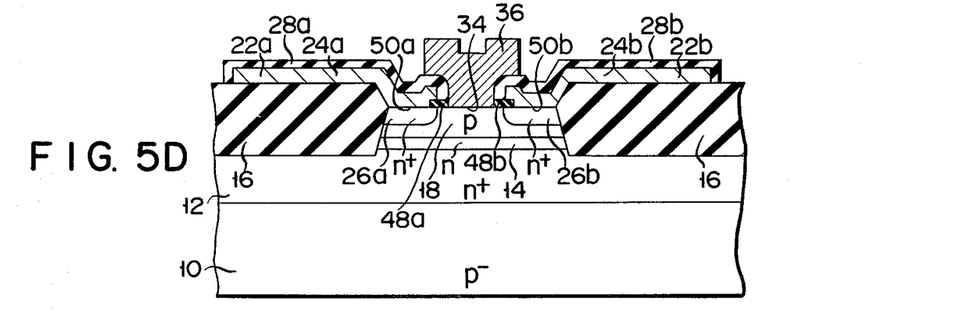

An exposed silicon nitride layer 48 is selectively etched away by a hot phosphoric acid or a dry etchant of CF4 family, as shown in FIG. 5D. The etchant does not etch the first and second oxide films 28a, 28b, 30a and 30b. Then, the exposed buffer oxide (not shown) is rinsed with hydrogen fluoride (HF). As a result, a base contact hole 34 is self-aligned with the second oxide films 30a and 30b, and the field oxide films 16. The silicon nitride layers 48a and 48b and the buffer oxide (not shown) are left between the contact hole 34 and each of the emitter diffusion windows 50a and 50b. An Al film is formed on the entire surface of the substructure, and the Al film is patterned to form a base Al wiring layer 36. The base Al wiring layer 36 is connected to the base region 18 through the contact hole 34 and serves as a word line.

Figure 5E:
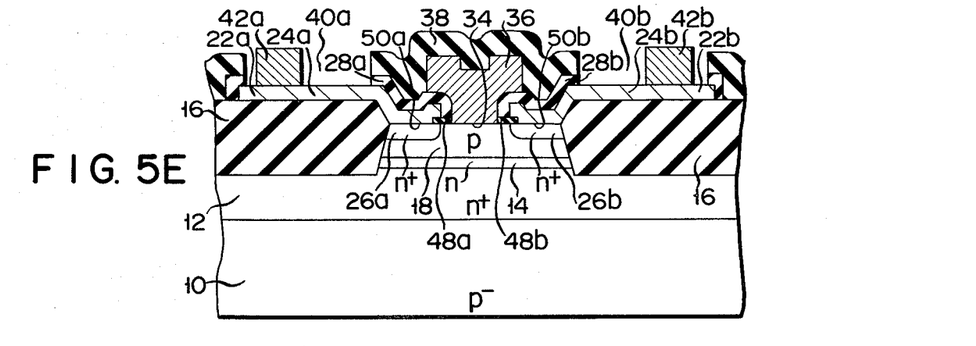
Figure 6:
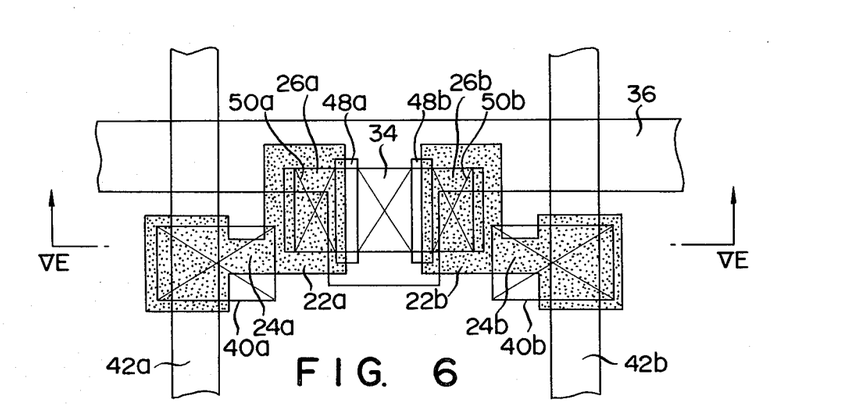
FIG. 6 is a plan view of the semiconductor memory device shown in FIG. 5E.

As shown in FIG. 5E, a phospho-silicate glass layer (PSG layer) 38 as an interlayer insulating film is deposited over the entire surface of the substructure. The PSG layer 38 and the first oxide films 28a and 28b are selectively etched away to expose the fuses 24a and 24b (see FIG. 6) and form through-holes 40a and 40b. An Al film is deposited over the entire surface of the substructure and the Al film is patterned to form Al wiring layers 42a and 42b serving as bit lines. The Al wiring layers 42a and 42b are connected to the poly-silicon wiring layers 22a and 22b through the through-holes 40a and 40b, respectively. In this way, a bipolar type PROM with two memory cells is formed in the base region 18. FIG. 6 shows a plan view of the PROM. FIG. 5E is a cross sectional view taken on line VE—VE in FIG. 6.

In the second embodiment, the poly-silicon wiring layers 22a and 22b are allowed to be separated from the base Al wiring layer 36 by the widths of the silicon nitride layers 48a and 48b, respectively. Accordingly, if the lateral diffusion distances of the emitter regions 26a and 26b formed by the diffusion of impurity from the poly-silicon wiring layers 22a and 22b, are respectively less than the widths of the silicon nitride layers 48a and 48b, the base and emitter are not short-circuited. Therefore, in the semiconductor memory device of the second embodiment, a probability that the base-emitter short-circuiting takes place is smaller than that in the semiconductor memory device in the first embodiment.

When a silicon nitride layer is formed, the first oxide films 28a and 28b and the second oxide films 30a and 30b may be formed thickly, thus improving a voltage breakdown of the device.

Removing the third oxide film 32 or the buffer oxide on the base region 18, there is a case that pin holes are formed in the first oxide films 28a and 28b or an abnormal etching locally takes place. In this case, Al enters the pin holes or the abnormal etched portion, possibly resulting in poor insulation. This problem can be overcome by employing the CVD process in order to form the first oxide films 28a and 28b, and the second oxide films 30a and 30b, as in a third embodiment to be given below.

Figure 7A:
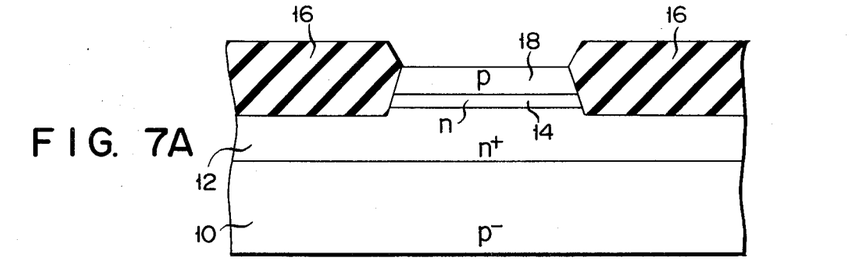
FIGS. 7A to 7E are cross sectional views of a semiconductor substrate for illustrating a third embodiment of a method of manufacturing a semiconductor memory device according to the present invention.

A third embodiment of a semiconductor device according to the present invention will be described referring to FIGS. 7A to 7E. An n+ buried layer 12 is formed on a p⁻-type silicon substrate 10, as shown in FIG. 7A. An n-type silicon epitaxial layer 14 is formed on the layer 12. Then, a field oxide film 16 serving as a first insulation layer and reaching the buried layer 12 is formed by the selective oxidization process. Through this step, the silicon epitaxial layer 14 is separated in an island fashion. Boron, for example, is doped into the island silicon epitaxial layer 14, by the diffusion process or the ion-implantation. Then, the substructure is subjected to the heat treatment to form a p-type base region 18 of which the longitudinal diffusion distance Xj is 0.5 μm and the sheet resistivity $\rho_s$ is 600 Ω/□.

Figure 7B:
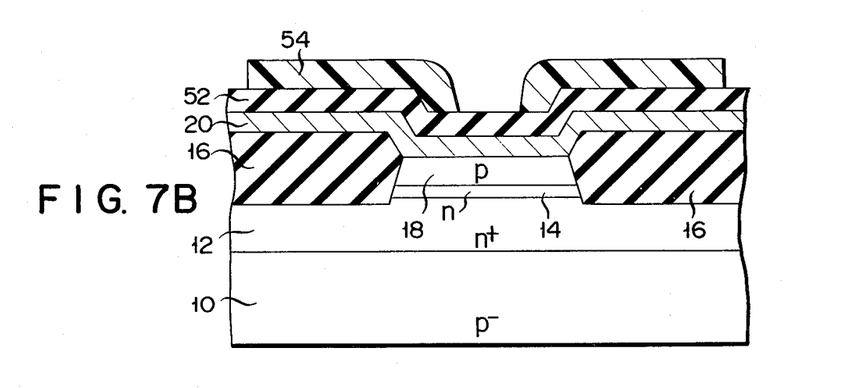

The oxide film (not shown) formed on the base region 18 by the heat process is etched away to expose the base region 18. Then, as shown in FIG. 7B, a poly-silicon film 20 of 3,000 Å in thickness doped with high concentration arsenic is formed by the depositing process, and a CVD-SiO₂ film 52 is further formed on the film 20. In order to form the base contact hole, a resist 54 is selectively deposited.

Figure 7C:
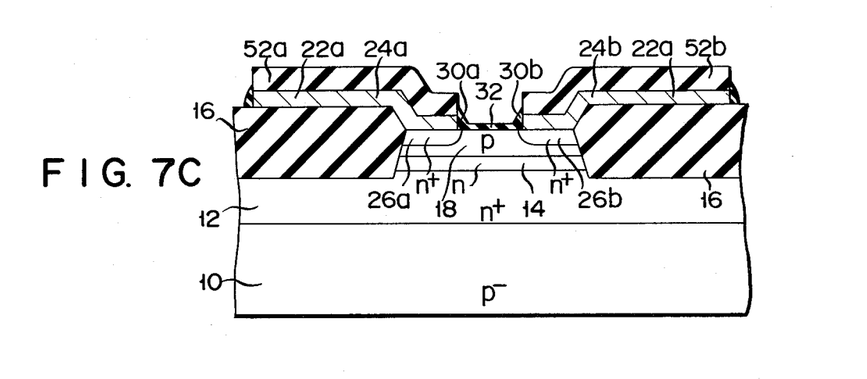

Then, as shown in FIG. 7C, the CVD-SiO₂ film 52 and the poly-silicon film 20 are subjected to an etching process with a resist 54 as a mask, to form two poly-silicon wiring layers 22a and 22b disposed substantially symmetrical with respect to the base region 18, and CVD-SiO₂ films 52a and 52b. The each poly-silicon wiring layers 22a and 22b contacts at each one end portion with part of the base region and extends at the other end portion over the field oxide film 16. The poly-silicon wiring layers 22a and 22b respectively have narrow width fuses 24a and 24b on the field oxide films 16. Then, the substructure is subjected to the heat treatment in an atmosphere of oxygen and nitrogen at 1,000° C., to diffuse arsenic from the poly-silicon wiring layers 22a and 22b into the base region 18 and to form n+-type emitter regions 26a and 26b. The substructure is subjected to a heat treatment in a wet atmosphere at 900° C. to form second oxide films 30a and 30b on side faces of the poly-silicon wiring layers 22a and 22b and to form a third oxide film 32 on the exposed base region 18. As previously state, the second oxide films 30a and 30b are formed thicker than the third oxide film 32.

Figure 7D:
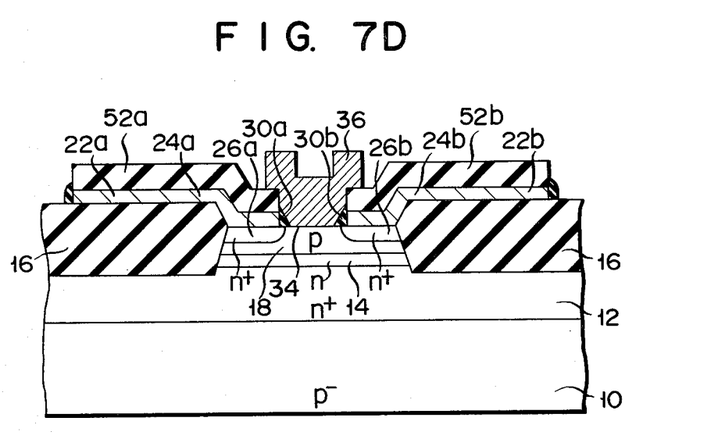

As shown in FIG. 7D, the thin third oxide film 32 on the base region 18 is removed by the hydrogen fluoride (HF) process, so that a base contact hole 34 is formed in a self-alignment with the second oxide films 30a and 30b formed on the side walls of the poly-silicon wiring layers 22a and 22b. An Al film is formed, by the deposition process, on the entire surface of the substructure, and the Al film is patterned to form a base Al wiring layer 36 connected to the base region 18 and serving as a word line. The base Al wiring layer 36 is insulated from the emitter regions 26a and 26b by the second oxide films 30a and 30b.

Figure 7E:
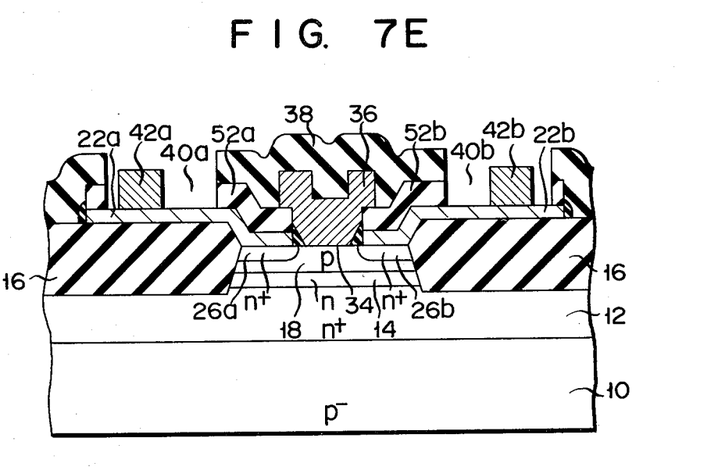

As shown in FIG. 7E, the phospho-silicate glass (PSG) layer is deposited on the entire surface. Then, the PSG layer 38 and the CVD-SiO₂ films 52a and 52b are selectively etched away to form through-holes 40a and 40b. An Al film is deposited on the entire surface of the substructure and the Al film is patterned to form Al wiring layes 42a and 42b serving as bit lines and connected to the poly-silicon wiring layers 22a and 22b through the through-holes 40a and 40b. Through the process steps, two memory cells are formed in the n-type epitaxial layer 14 separated in an island fashion.

In the CVD-SiO₂ film 52 with no impurity, the film quality is better than the thermal oxide film formed by oxidizing poly-silicon containing a large amount of impurity. For this reason, the pin holes are hard to be formed in the CVD-SiO₂ film 52. A withstanding voltage of the device is increased. The CVD-SiO₂ film 52 may be formed thicker than the thermal oxide film. This fact is further facilitates the prevention of the pin hole formation.

It should be understood that the semiconductor memory device is not limited to the above-mentioned embodiments. One or three memory cells may be provided for the base region 18 formed in an island fashion. When one memory cell is provided for the base region 18, that is to say, one emitter region is provided, the base contact hole is self-aligned with the second oxide film on the side face of the poly-silicon wiring layer and the side surface of the field oxide film.

What is claimed is:

1. A semiconductor memory device comprising:
   a first semiconductor region of first conductivity type;
   a first insulation layer for separating elements formed in said first semiconductor region;
   a second semiconductor region of second conductivity type contacting with said first semiconductor region, and formed in an island fashion by said first insulation layer;
   a third semiconductor region of first conductivity type provided in said second semiconductor region;
   a poly-silicon wiring layer connected to said third semiconductor region and extending over said first insulation layer, said poly-silicon wiring layer containing high concentration impurity of first conductivity and serving as a fuse;
   a first insulating film formed on the surface of said poly-silicon wiring layer;
   a second insulating film formed on the side face of said poly-silicon wiring layer; and
   an electrode connected to said second semiconductor region through a contact hole formed in self-alignment with said second insulating film.

2. A semiconductor memory device according to claim 1, further comprising:
   a second insulation layer formed over the surfaces of said second and third semiconductor regions so as to contact at one end with said electrode and at the other end to said poly-silicon wiring layer, said second insulating film being formed on said second insulation layer.

3. A semiconductor memory device according to claim 1 or 2, further comprising:
   a poly-silicon layer containing second conductivity type impurity and interposed between said electrode and said second semiconductor region; and
   a fourth semiconductor region connected to said poly-silicon layer and said third semiconductor region.

* * * * *